Aug. 27, 1968 D. E. SAWYER 3,399,313
PHOTOPARAMETRIC AMPLIFIER DIODE
Filed April 7, 1965
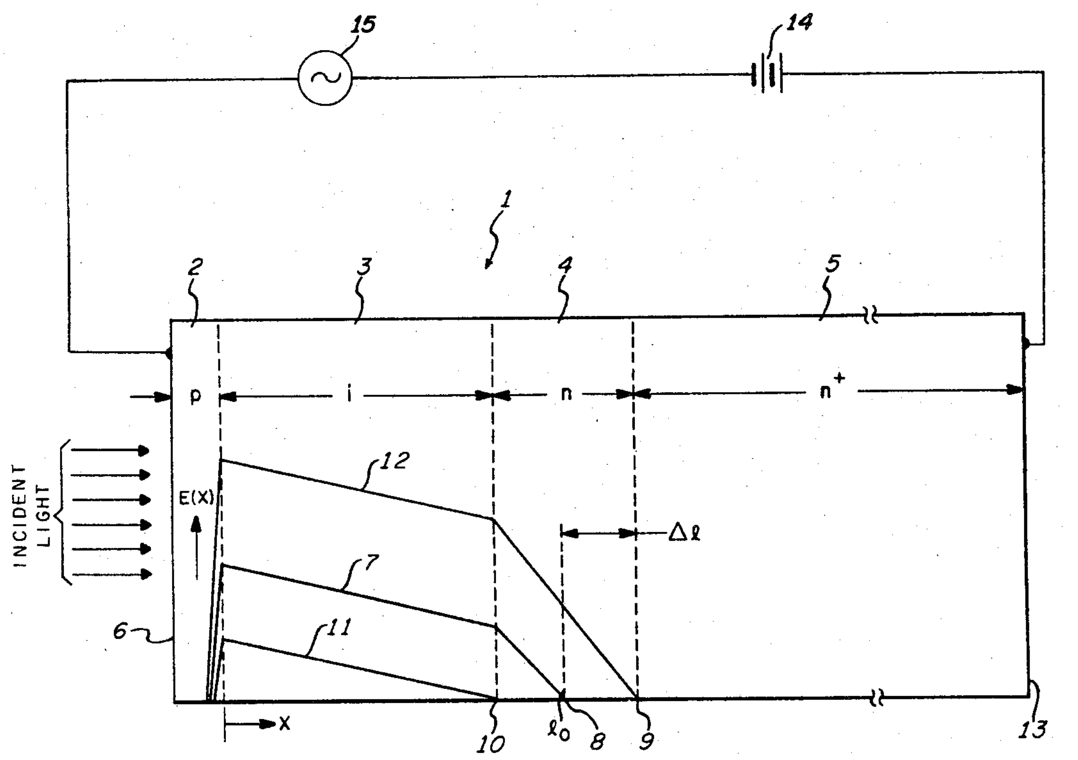
INVENTOR.
DAVID E. SAWYER
BY
Robert J. Haase
ATTORNEY United States Patent Office 3,399,313
Patented Aug. 27, 1968

3,399,313

PHOTOPARAMETRIC AMPLIFIER DIODE

David E. Sawyer, Northboro, Mass., assignor to Sperry Rand Corporation, Great Neck, N.Y., a corporation of Delaware Filed Apr. 7, 1965, Ser. No. 446,215
7 Claims. (Cl. 307—311)

ABSTRACT OF THE DISCLOSURE

Photoparametric amplifier means including a source of bias signal, a source of pump signal and a multi-layered semiconductor wafer wherein the successive layers are of p, i, n and n+ conductivity types, the "i" layer being slightly "n" in conductivity type. The surface of the "p" conductivity layer is illuminated by modulated light. The bias and pump signals produce within the wafer a junction field whose terminal edge moves solely within the "n" conductivity layer.

The invention herein described was made in the course of or under a contract or subcontract thereunder, with the Department of the Navy.

The present invention generally relates to semiconductor junction devices adapted for the photodetection and amplification of optical signals and, more particularly, to such a device wherein amplification is achieved without degradation of detection capability.

A semiconductor photodiode is a p-n junction diode arranged so that the junction, or portions of the diode close to the junction, can be illuminated by an optical signal which is to be detected. The incoming photons create electron hole pairs which move in the field in opposite directions and give rise to a signal current. In operation, a reverse bias is put on the diode. The characteristics of the device for small excursions around the bias point are similar to those of a signal-current generator and a direct-current generator in parallel with a capacitance and the entire parallel combination of generators and capacitance being connected in series with a parastic resistance. In general, the parasitic series resistance is a function of the bias voltage because the latter determine the extent of junction field penetration into originally undepleted semiconductor regions. Said resistance is related to that of the semiconductor material which lies beyond the junction field region, i.e., the semiconductor material between the edge of the junction field and the ohmic contact opposite the illuminated face of the photodiode. A p-n junction diode, when operated as a photodiode produces an output proportional to the intensity of the incident light. The photodiode output normally is so small that further amplification is required. Thus, a practical receiver of light would include a photodiode followed by a low-noise amplifier. It is preferable that the low-noise amplifier be a varactor parametric amplifier.

Both the varactor and photodiode use p-n- junctions of similar structure. Thus, it is logical that both functions (photodetection and parametric amplification) be performed by a single junction. The principal noise limitation on both of the microwave photodiode and the varactor is the aforementioned parasitic series resistance of the diodes. Intuitively, one might expect that if both operations took place in a single junction, the noise would be reduced because the signal would not have to travel through two separate series resistances in travelling from the detector to the amplifier. However, special provision must be made to insure that the detection capability of the photodiode is not degraded as a consequence of the application of the parametric amplifier pump signal which causes the edge of the junction field to sweep back and forth within the semiconductor material about the field edge position determined solely by the reverse bias. In accordance with the present invention, photodetection capability is preserved by insuring that the junction field edge always is situated within a low resistivity region of the photodiode semiconductor material for all values of the pump signal.

It is a general object of the present invention to provide a unitary semiconductor device for the simultaneous detection and amplification of incident light.

A more specific object is to provide a photoparametric amplifier semiconductor device in which amplification is achieved without degradation of photodetection capability.

Another object is to provide a p-n junction semiconductor device suitable for the simultaneous photodetection and amplification of incident light and being characterized by a junction field which always terminates within a low resistivity region during operation.

These and other objects of the present invention, as will appear from a reading of the following specification are achieved in a representative embodiment by the provision of a multi-layered semiconductor wafer wherein the successive layers are of p, i, n, and n+ conductivity types. The i layer of the wafer rather than being strictly intrinsic semiconductor material is very slightly n conductivity type. The wafer is arranged for the surface illumination of the p conductivity layer by modulated incident light which is to be detected and amplified. The wafer is quiescently reversed biased so that the junction field terminates substantially midway within the n layer in the absence of a pump signal. Provision is also made for the application of a parametric amplifier pump signal to the wafer of a magnitude which causes the junction field edge to sweep about the quiescent bias point within the n layer. Thus, the junction field edge moves within the semiconductor material between the i and n boundaries of the n layer without ever crossing either boundary. In this manner a relatively wide junction field is maintained throughout the entire i layer while the series resistance of the device is held to the acceptable low values characteristic of the n and n+ layers for optimum detection capability while achieving varactor parametric amplifier operation.

For a more complete understanding of the invention, reference should be had to the following specification and to the sole figure which is a diagrammatic sketch of the multilayered diode of the present invention.

The dimensions of the diode have been exaggerated in the sketch for the sake of clarity of exposition. In a typical instance, the thickness of the respective layers comprising semiconductor wafer 1 are as follows:

| | | |
|---|---|---|
| p layer 2 | micron | ½ to 1 |
| i layer 3 | mils | .7 |
| n layer 4 | do | .3 |
| n+ layer 5 | do | 5 to 10 |

Semiconductor device 1 may be fabricated using conventional techniques. For example, starting with an n+ doped substrate 5 of silicon, an additional layer 4 of more lightly doped n silicon is deposited on the base layer 5. Then an additional 3 of substantially intrinsic silicon (actually very slightly n) is deposited on n layer 4. Finally, the p layer 2 is formed by diffusing p conductivity type dopant into the surface of intrinsic layer 3. Incident light which is to be photodetected and amplified impinges on surface 6 of p layer 2.

Conventional ohmic contact means (not shown) are connected to the outer surfaces of layers 2 and 5 for reverse biasing the p-i (i being very slightly n) junction for the creation of the quiescent junction field represented by the line 7. It will be noted that the quiescent field terminates substantially midway in layer 4 which is of low resistivity n materal. Thus, the series resistance of the device is determined by the low resistivity materials of n layer 4 and n+ layer 5 which separate the field edge from the output surface 13 of the photoparametric amplifier diode. Additional conventional means (not shown) are provided for the application of a pump signal for the parametric amplification of the modulation on the incident light. The bias signal and pump signal sources are represented schematically by sources 14 and 15, respectively. Suitable means for application of the bias signal are disclosed in the paper "Photodiode Detection," by L. K. Anderson, in the Proceedings of the Symposium on Optical Masers, Apr. 16–19, 1963, page 549, Polytechnic Press 1963. Suitable means for application of the pump signal are disclosed in the paper "Detection and Amplification of the Microwave Signal in Laser Light by a Parametric Diode" by S. Saito et al., page 567 in the aforementioned Proceedings. The peak-to-peak pump signal strength is adjusted so that the termination of the junction field is swung back and forth about quiescent bias point 8 within n layer 4 between boundaries 9 and 10 at the respective interfaces of n+ layer 5 and i layer 3.

Lines 7, 11 and 12 are plots of the junction field intensity versus distance within the semiconductor wafer resulting from the sum of the quiescent reverse bias and three respective instantaneous pump signal amplitudes. The junction field intensity is represented by the ordinate $E_x$ whereas the distance within the wafer is represented by the abscissa $x$. The quiescent bias applied to the wafer causes the junction field to terminate at the distance $x=l_0$ corresponding to point 8. The peak excursion of the pump signal in the direction of the quiescent bias causes the junction field edge to penetrate to point 9 of n layer 4. For the opposite peak excursion of the pump signal, the junction field edge withdraws to point 10 within n layer 4. Thus, all positions of the junction field edge are confined within the n layer 4. It will be noted that the major portion of the total junction field width is maintained within intrinsic layer 3 whose relatively higher resistivity permits the realization of the wide junction field required for good photodetection capability. However, the termination of the junction field in the relatively low resistivity n region rather than in the intrinsic region 3 minimizes the series resistance of the device to maintain optimum photodetection capability.

The invention may be better understood by comparison with a typical prior art photodiode structure such as the one described in the aforementioned paper by L. K. Anderson. The cited structure comprises a diffused junction n-i-p+ diode operated with the optical radiation incident on the diffused (n) surface. The i region thickness is the same as the junction field width with only bias voltage applied and is chosen to maximize signal-to-noise ratio. As is the case with all varactor parametric amplifiers, however, the junction elastance must be varied about a quiescent value corresponding to the quiescent reverse bias. Thus, the position of the edge of the junction field would be swept into and out of the intrinsic layer if the diode is constructed and quiescently biased as shown in the aforementioned paper. The result would be a substantial increase in series resistance of the photoparametric amplifier device and a consequent degradation of detection capability in the attempt to achieve gain.

In accordance with the present invention, on the other hand, the series resistance factor is substantially reduced by the provision of an n layer intermediate the intrinsic and the heavily doped layers of the prior art device with the junction field terminating approximately midway in the n region under the influence of the quiescent reverse bias. The thickness of the n region is determined by the required elastance variation, i.e., by the range of the total excursion of the junction field edge during photoparametric operation. The series resistance due to the added n region is negligible.

It should be understood that although the present invention has been described in terms of a multiple layer p-i-n-n+ device, the invention is equally applicable to a multiple layer n-i-p-p+ photoparametric amplifier diode.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. In combination, a photoparametric device, a source of bias signal and a source of pump signal, said device being connected to receive said bias signal and said pump signal for detecting and amplifying incident modulated light, said device comprising multiple layered semiconductor material consisting of
   - a first doped layer of one conductivity,
   - a second layer of substantially intrinsic conductivity contiguous with said first layer, said second layer forming a p-n junction with said first layer at the boundary therebetween, and
   - a third doped layer of conductivity opposite to said one conductivity contiguous with said second layer,
   - means for applying said bias signal to said device to establish a junction field in said material having a termination at a quiescent point within said third layer, and
   - means for applying said pump signal to said device to cause said field termination to sweep about said quiescent point without traversing the boundaries of said third layer.

2. In combination, a photoparametric device, a source of bias signal and a source of pump signal, said device being connected to receive said bias signal and said pump signal for detecting and amplifying incident modulated light, said device comprising multiple layered semiconductor material consisting of
   - a first doped layer of one conductivity,
   - a second layer of substantially intrinsic conductivity contiguous with said first layer, said second layer forming a p-n junction with said first layer at the boundary therebetween, and
   - a third doped layer of conductivity opposite to said one conductivity contiguous with said second layer,
   - means for applying said bias signal to said device to establish a junction field in said material having a termination at a quiescent point substantially midway within said third layer, and
   - means for applying said pump signal to said device to cause said field termination to depart from said quiescent point by a peak amount less than half the thickness of said third layer.

3. In combination, a photoparametric device, a source of bias signal and a source of pump signal, said device being connected to receive said bias signal and said pump signal for detecting and amplifying incident modulated light, said device comprising multiple layered semiconductor material consisting of
   - a first doped layer of one conductivity,
   - a second layer of substantially intrinsic conductivity contiguous with said first layer, said second layer forming a p-n junction with said first layer at the boundary therebetween,
   - a third doped layer of conductivity opposite to said one conductivity contiguous with said second layer, and
   - a fourth heavily doped layer of said opposite conductivity contiguous with said third layer,
   - means for applying said bias signal to said device to establish a junction field in said material having a termination at a quiescent point within said third layer, and means for applying said pump signal to said device to cause said field termination to sweep about said quiescent point without traversing the boundaries of said third layer.

4. In combination, a photoparametric device, a source of bias signal and a source of pump signal, said device being connected to receive said bias signal and said pump signal for detecting and amplifying incident modulated light, said device comprising multiple layered semiconductor material consisting of a first doped layer of one conductivity, a second layer of substantially intrinsic conductivity contiguous with said first layer, said second layer forming a p-n junction with said first layer at the boundary therebetween, a third doped layer of conductivity opposite to said one conductivity contiguous with said second layer, and a fourth heavily doped layer of said opposite conductivity contiguous with said third layer, means for applying said bias signal to said device to establish a junction field in said material having a termination at a quiescent point substantially midway within said third layer, and means for applying said pump signal to said device to cause said field termination to depart from said quiescent point by a peak amount less than half the thickness of said third layer.

5. A photoparametric device as defined in claim 4 wherein said first, second, third and fourth layers of semiconductor material are of p, i, n, and $n^+$ conductivity, respectively.

6. In combination, a photoparametric device, a source of bias signal and a source of pump signal, said device being connected to receive said bias signal and said pump signal for detecting and amplifying incident modulated light, said device comprising multiple layered semiconductor material consisting of a first doped layer of one conductivity, a second layer of substantially intrinsic conductivity contiguous with said first layer, said second layer forming a p-n junction with said first layer at the boundary therebetween, and a third doped layer of conductivity opposite to said one conductivity contiguous with said second layer, means for applying said bias signal to said device to establish a junction field in said material having a termination at a quiescent point substantially midway within said third layer, means for applying said pump signal to said device to cause said field termination to sweep back and forth about said quiescent point, the thickness of said third layer being at least as great as the total peak-to-peak excursion of said field termination within said third layer in response to said pump signal.

7. In combination, a photoparametric device, a source of bias signal and a source of pump signal, said device being connected to receive said bias signal and said pump signal for detecting and amplifying incident modulated light, said device comprising multiple layered semiconductor material consisting of a first doped layer of one conductivity, a second layer of substantially intrinsic conductivity contiguous with said first layer, said second layer forming a p-n junction with said first layer at the boundary therebetween, a third doped layer of conductivity opposite to said one conductivity contiguous with said second layer, and a fourth heavily doped layer of said opposite conductivity contiguous with said third layer, means for applying said bias signal to said device to establish a junction field in said material having a termination at a quiescent point substantially midway within said third layer, means for applying said pump signal to said device to cause said field termination to sweep back and forth about said quiescent point, the thickness of said third layer being at least as great as the total peak-to-peak excursion of said field termination within said third layer in response to said pump signal.

References Cited

UNITED STATES PATENTS

| | | | |
|---|---|---|---|
| 2,986,591 | 5/1961 | Swanson et al. | 136—89 |
| 3,043,959 | 7/1962 | Diemer | 250—211 |
| 3,170,067 | 2/1965 | Kibler | 250—211 |
| 3,192,398 | 6/1965 | Benedict | 307—88.5 |
| 3,196,327 | 7/1965 | Dickson | 317—234 |
| 3,229,106 | 1/1966 | Lord et al. | 250—217 |
| 3,245,002 | 4/1966 | Hall | 331—94.5 |
| 3,265,899 | 8/1966 | Bergstrom et al. | 250—211 |
| 3,267,294 | 8/1966 | Dumke et al. | 307—88.5 |
| 3,283,160 | 11/1966 | Levitt et al. | 250—213 |

JOHN W. HUCKERT, *Primary Examiner.*

R. F. SANDLER, *Assistant Examiner.*